United States Patent [19]

Anagnostopoulos et al.

[11] Patent Number: 5,235,196

[45] Date of Patent: Aug. 10, 1993

[54] TRANSFER REGION DESIGN FOR CHARGE-COUPLED DEVICE IMAGE SENSOR

[75] Inventors: Constantine N. Anagnostopoulos, Mendon; Herbert J. Erhardt, Rochester; Eric G. Stevens, Rochester; Robert H. Philbrick, Rochester, all of N.Y.

[73] Assignee: Eastman Kodak Company, Rochester, N.Y.

[21] Appl. No.: 918,093

[22] Filed: Jul. 24, 1992

[51] Int. Cl.$^5$ ............... H01L 29/78; H01L 27/14; H01L 31/00
[52] U.S. Cl. .................. 257/223; 257/230; 257/234; 257/249
[58] Field of Search ........... 357/24 LR, 24 M, 24; 377/60, 61, 62, 63; 358/213.27, 213.29; 257/222, 223, 229, 230, 234, 249, 250

[56] References Cited

U.S. PATENT DOCUMENTS

| | | | |
|---|---|---|---|
| 4,528,594 | 7/1985 | Kadekodi et al. | 357/27 LR |
| 4,613,402 | 9/1986 | Losee et al. | 156/643 |
| 4,717,945 | 1/1988 | Yusa et al. | 357/24 |
| 4,975,977 | 12/1990 | Lee et al. | 358/213.19 |
| 5,060,245 | 10/1991 | Nelson | 357/60 |

FOREIGN PATENT DOCUMENTS 58-220573 12/1983 Japan.

OTHER PUBLICATIONS

Burkey et al "The Pinned Photodiode for an Interline-Transfer CCD Image Sensor", Proceedings IEEE IEDM, vol. 84, pp. 28-31, Dec. 1984.

Primary Examiner—Andrew J. James
Assistant Examiner—Ngan Van Ngo
Attorney, Agent, or Firm—Stephen C. Kaufman

[57] ABSTRACT

The present invention is directed to an image sensor which comprises a body of a semiconductor material having therein a plurality of photodetectors arranged in a line and a CCD shift register extending along the line of photodetectors adjacent to but spaced from an edge of the photodetectors. The CCD shift register includes a channel region and a plurality of first and second gate electrodes extending over and insulated from the channel region. One of each of the first and second gate electrodes extends across a portion of the edge of each photodetector. Each of the first electrodes has an arm extending along the entire edge of its respective photodetector between the photodetector and the second gate electrode. A separate transfer region is in the body between the edge of each photodetector and its respective first electrode and extends along the entire edge of the photodetector. A transfer gate is over and insulated from the transfer regions.

20 Claims, 2 Drawing Sheets

TRANSFER REGION DESIGN FOR CHARGE-COUPLED DEVICE IMAGE SENSOR

FIELD OF THE INVENTION

The present invention relates to a charge-coupled device (CCD) image sensor, and, more particularly, to a high resolution CCD image sensor having a large number of closely spaced pixels.

BACKGROUND OF THE INVENTION

Generally, CCD image sensors comprise a plurality of photodetectors (such as photodiodes or photocapacitors) arranged in an array. The array may be linear in which the photodetectors are in a single line, or area where the photodetectors are arranged in a plurality of rows and columns. The image sensor also includes at least one CCD shift register. In a linear array the shift register extends along the line of photodetectors. In an area array there is a separate shift register along each column of the photodetectors vertically, and a horizontal shift register connecting all of the vertical ones. Each CCD shift register comprises a channel region and a plurality of gate electrodes over and insulated from the channel region. The gate electrodes are arranged along the channel region.

A common type of image sensor uses a two-phase shift register in which there are two sets of gate electrodes with a pair of gate electrodes (one from each set) being adjacent each photodetector. There is also a transfer means between each photodetector and its adjacent shift register by which charges generated and collected in the photodetector are transferred to the shift register. It is a common practice in a two phase shift register to provide a transfer region between a portion of each of the photodetectors and one of the electrodes adjacent thereto. Thus, charges from the photodetector are transferred to the channel region of the shift register under only one of the gate electrodes of the adjacent set of gate electrodes.

In order to increase the resolution of a CCD image sensor, it is necessary to increase the number of pixels (photodetectors) in the device. However, in order to maintain the image sensor at a relatively small size, the size of each photodetector and the spacing between photodetectors must be decreased to allow more of the photodetectors to be formed without increasing the area of the device. Decreasing the size of the photodetectors also requires decreasing the size of the related elements, such as the gate electrodes and the transfer regions between the photodetectors and the shift registers. However, decreasing the width of the transfer regions leads to considerable narrow width effects, including the requirement that the voltages on the transfer gates and the CCD gate electrodes be substantially different from each other, which results in increased system complexity.

SUMMARY OF THE INVENTION

The present invention is directed to a CCD image sensor having a plurality of photodetectors, a CCD shift register comprising a shift register channel region along but spaced from the photodetectors, and a transfer region between an edge of the photodetectors and the shift register. The size (length and width) of the photodetectors can be reduced to increase the resolution of the image sensor. The width of the transfer regions between each of the photodetectors and the shift register is modified so as to be essentially the same as the width of the photodiode to prevent the occurrence of narrow width effects in the transfer regions. First and second conductive gate electrodes are over and insulated from the channel region with each of the gate electrodes extending along at least a portion of the edge of the photodetector. The first gate electrode has a portion which extends between the channel region and the edge of the photodetector along the entire edge of the photodetector.

The image sensor of the present invention comprises a body of a semiconductor material having a surface. A photodetector having an edge is in the body at the surface. A shift register channel region is in the body at the surface and extends along but spaced from the edge of the photodetector. First and second conductive gate electrodes are over and insulated from the channel region with each of the gate electrodes extending along at least a portion of the edge of the photodetector. The first gate has a portion which is adjacent to and extends along the entire edge of the photodetector. A transfer region is in the body at the surface and extends between the photodetector and the shift register channel region along the entire edge of the photodetector.

The invention will be better understood from the following more detailed description taken with the accompanying drawings and claims.

DETAILED DESCRIPTION

Figure 1:
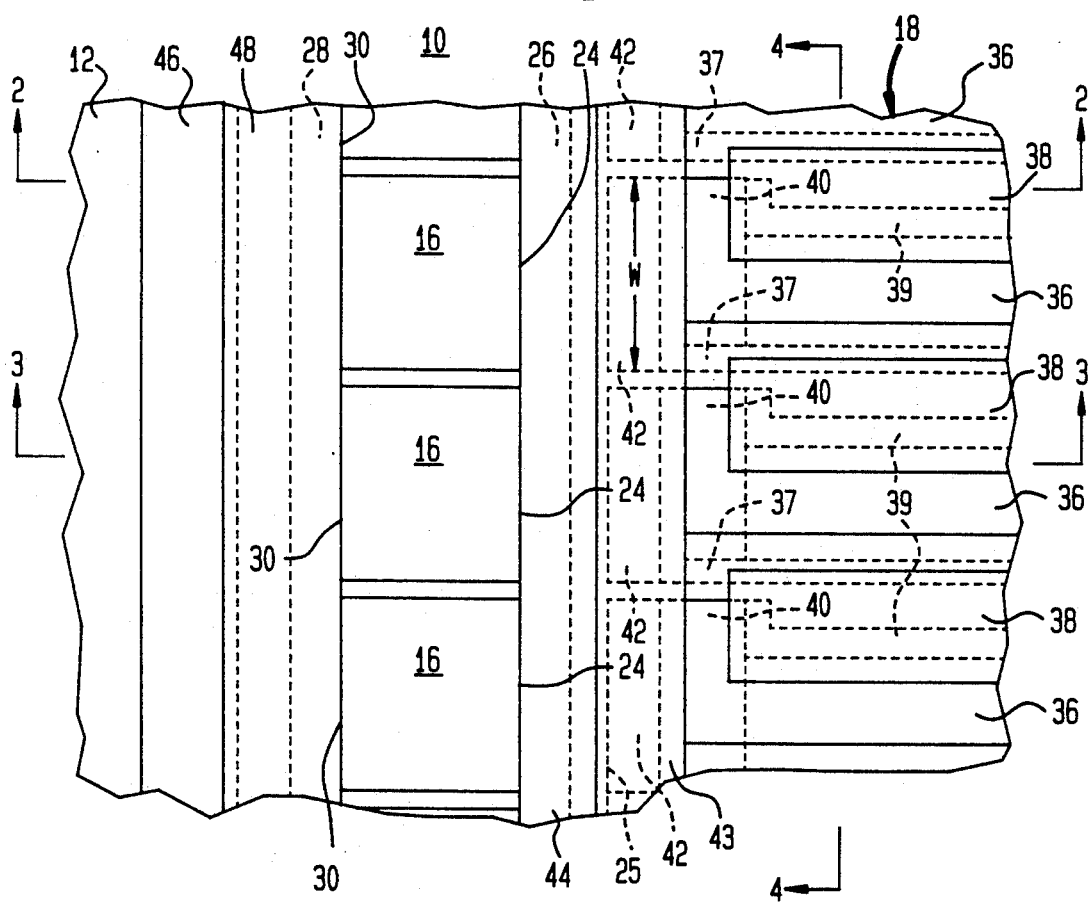
FIG. 1 is a top plan view of a portion of a CCD image sensor in accordance with the present invention.

Referring now to FIGS. 1, 2, 3 and 4, there are shown a top plane view (FIG. 1), a first sectional view (FIG. 2) taken through a dashed line 2—2 of FIG. 1, a second sectional view (FIG. 3) taken through a dashed line 3—3 of FIG. 1, and a third sectional view (FIG. 4) taken through a dashed line 4—4 of FIG. 1, respectively, of a portion of a CCD image sensor 10 in accordance with the present invention. Image sensor 10 comprises a body 12 of a semiconductor material of one conductivity type, such as p-type conductivity silicon, having a surface 14. In the body 12 and at the surface 14 are a plurality of photodetectors 16 which are arranged in an array. The photodetectors 16 may be arranged in a liner array in which the photodetectors 16 are arranged in a line, as is shown, or an area array in which the photodetectors 16 are arranged in rows and columns. A CCD shift register 18 is in the body 12 and extends to the surface 14. The shift register 18 extends along either a line of the photodetectors 16, in a linear array, as is shown, or a column of the photodetectors 16 in an area array.

Figure 2:
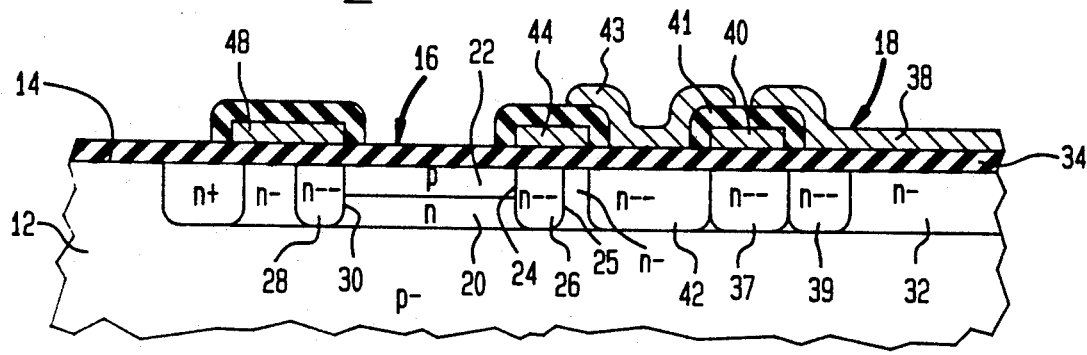
FIG. 2 is a sectional view taken along a dashed line 2—2 of FIG. 1.
Figure 3:
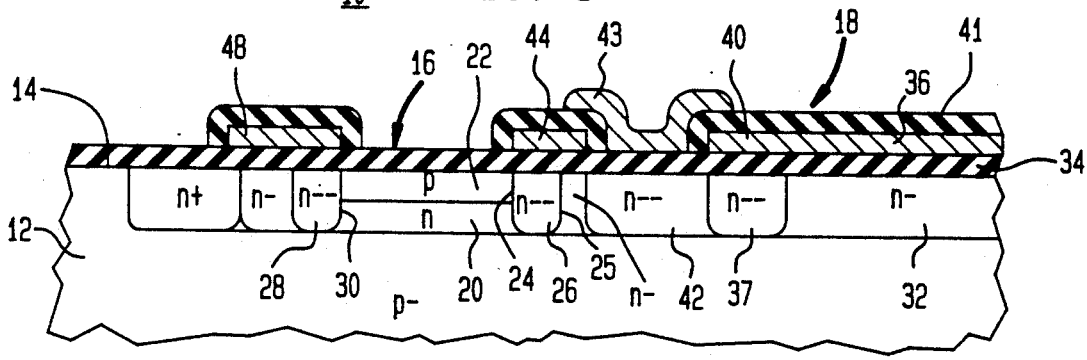
FIG. 3 is a sectional view taken along a dashed line 3—3 of FIG. 1.

As shown in FIGS. 2 and 3, each of the photodetectors 16 is a photodiode, and more particularly, a pinned photodiode. A pinned photodiode is described in the article of B. C. Burkey et al., entitled "The Pinned Photodiode for an Interline Transfer CCD Imager", PROCEEDINGS IEEE IEDM, Vol. 84, pgs. 28-31, December 1984. The pinned photodiode 16 comprises a first region 20 of n-type conductivity in the body 12 and extending to the surface 14, and a second region 22 of p-type conductivity within a portion of the first region 20 and extending to the surface 14. The first region 20 has a configuration looking down on the surface 14 of a rectangle with one edge 24 being adjacent, but spaced from the shift register 18. A first barrier region 26 of n-- type conductivity is in the body 12 and extends to the surface 14 and in one direction to the edge 24 of the photodiodes 16. A second barrier region 28 of n-- type conductivity is in the body 12 and extends to the surface 14 along an edge 30 of the photodiodes 16 which is opposite the edge 24. The barrier regions 26 and 28 are formed by implanting a p-type dopant into the n-type region so as to counterdope the n-type region and make it of n-- type conductivity having a surface concentration of impurity of about $7.5 \times 10^{16}$ impurities/cm$^3$.

The CCD shift register 18 comprises a buried channel region 32 of n- type conductivity in the body 12 and extending to the surface 14. The CCD shift register 18 is made in the manner described in U.S. Pat. No. 4,613,402 to D. L. Losee et al., issued Sep. 23, 1986, entitled "Method of Making Edge Aligned Implants and Electrodes Thereof". The channel region 32 extends along but is spaced from the edge 24 of the photodiodes 16. A dielectric layer 34, typically of silicon dioxide, is on the surface 14 and extends over the channel region 32. First and second gate electrodes 36 and 38 are on the dielectric layer 34 and extend across the channel region 32. The gate electrodes 36 and 38 are of a conductive material, such as doped polycrystalline silicon. The first and second gate electrodes 36 and 38 alternate along the channel region 32 so that there is one pair of the gate electrodes 36 and 38 at each of the photodiodes 16. As shown in FIG. 1, each of the gate electrodes 36 and 38 is of a width substantially one/half the width of a photodiode 16. However, each of first gate electrodes 36 has an arm 40 at an end thereof which is adjacent the photodiode 16 which extends along the entire width of the edge 24 of the photodiode 16. The second gate electrode 38 is not as long as the first gate electrode 36 so that it overlaps only a small portion of the arm 40 and is insulated therefrom by a layer 41 of insulating material, typically silicon dioxide.

Figure 4:
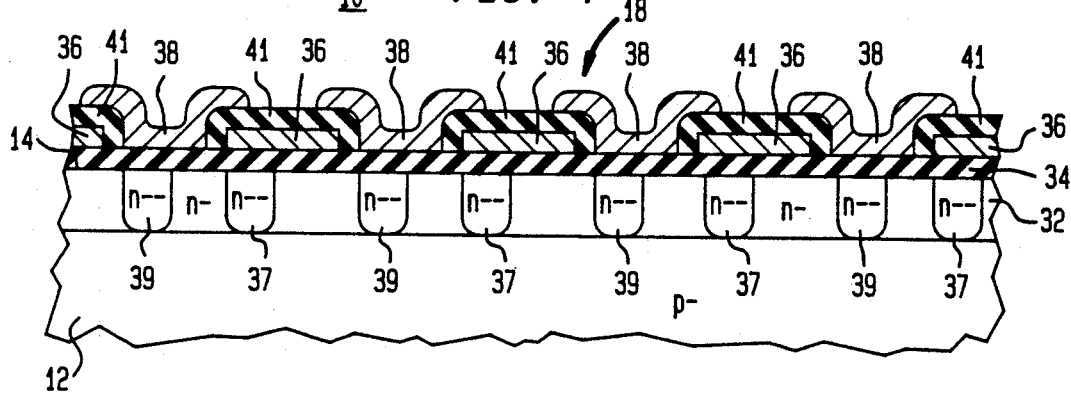
FIG. 4 is a sectional view taken along a dashed line 4—4 of FIG. 1.

As shown in FIGS. 1 and 4, a separate barrier region 37 of n-- type conductivity (an impurity concentration of about $7.5 \times 10^{16}$ impurities/cm$^3$) is in the body 12 and extends to the surface 14 under but spaced from each of the first gate electrodes 36. Each of the barrier regions 37 extends across the channel region 32 along an edge of its respective first gate electrode 36. As shown in FIGS. 1, 2 and 3, each of the barrier regions 37 also extends under the arm 40 of the respective first gate electrode 36. As shown in FIGS. 1 and 4, a barrier region 39 of n-- type conductivity (an impurity concentration of about $6 \times 10^{16}$ impurities/cm$^3$) is in the body 12 and extends to the surface 14 under and spaced from each of the second gate electrodes 38. Each of the barrier regions 39 extends across the channel region 32 along an edge of its respective second gate electrode 38. As shown in FIGS. 1 and 2, each of the barrier regions 39 also extends across the end of its respective second gate electrode 38 and abuts the barrier region 37 of the adjacent first gate electrode 36. The barrier regions 37 and 39 have slightly different doping concentrations to compensate for the slight differences in gate oxide thickness of the first and second polycrystalline silicon gates. The presence of both barrier region serves to prevent charge carriers from flowing from the first gate electrodes 36 back to the photodiodes 16 and from the second gate electrodes 38 into the first gate electrodes 36.

A separate transfer region 42 of n- type conductivity (an impurity concentration of about $6 \times 10^{16}$ impurities/cm$^3$) is in the body 12 and extends to the surface 14 and along one side to an edge 25 of region 26. The transfer region 42 is of the same width W (FIG. 1) as the width W (FIG. 1) of the photodiode 16 and extends between the edge 25 of the first barrier region 26 and the channel region 32 of the shift register 18. Typically regions 42 and 32 are portions of a common n-type layer. The dielectric layer 34 extends over the transfer regions 42. A pair of parallel transfer gates 43 and 44 (FIGS. 1 and 3) are on the dielectric layer 34 and extends along all of the photodetectors 16 and over the transfer regions 42. The transfer gates 43 and 44 are of a conductive material, such as doped polycrystalline silicon, and are of a combined width to extend between the first barrier region 26 and the arms 40 of the first gate electrodes 36. If desired, a single transfer gate can be used satisfactorily instead of the pair of transfer gates 43 and 44.

An overflow drain region 46 (FIGS. 1 and 3) of n+ type conductivity is in the body 12 and extends to the surface 14 adjacent to the edge 31 of all of the barrier region 28. The dielectric layer 34 extends over the second barrier region 28 and the overflow drain regions 46. A lateral overflow gate 48 is on the dielectric layer 34 and extends between the second barrier region 28 and the overflow drain region 46. The lateral overflow gate 48 is of a conductive material, such as doped polycrystalline silicon.

In the image sensor 10, the transfer region 42 between each of the photodiodes 16 and the channel region 32 of the shift register 18 is of the same width as the photodiodes 16. Thus, even if the photodiodes 16 are reduced in size to allow a larger number of the photodiodes 16 to be formed on the same size body 12, the transfer regions 42 are still the same width as the photodiodes 16. Thus, the transfer regions 42 are always of a size capable of transferring charge from the photodiodes 16 to the shift register 18 without any detrimental narrow width effects. Even though the transfer regions 42 extend along the full width of their respective photodetectors 16, each of the first gate electrodes 36 is shaped by means of the arm 40 so that only the first gate electrode 36 extends along the transfer region 42. Thus, during operation, charge from the photodiodes 16 is transferred into the channel region 32 of the shift register 18 only under one of the gate electrodes 36 and 38. Alternatively, if both CCD gate electrodes 36 and 38 are biased positively, then charge from the photodiodes 16 would transfer to both gate electrodes 36 and 38. With the CCD operated normally, subsequent to this transfer operation, no mixing of charge of adjacent pixels occurs.

It is to be appreciated and understood that the specific embodiments of the invention are merely illustrative of the general principles of the invention. Various modifications may be made consistent with the principles set forth. For example, other types of photodetectors, such as photocapacitors, can be substituted for pinned diode photodetectors 16. Still further, the shift register 18 can have a surface channel region rather than a buried channel region, and other types of overflow means can be used instead of the lateral overflow drain shown. Furthermore, the channel region 32 of the shift register 18 may be provided with storage and transfer regions under each gate electrode 36 and 38 as is well known in the art. Finally, this structure or similar structures of the transfer region from the photodetector to the CCD can be utilized in area CCD arrays for the transfer regions between the photodetectors and the vertical CCD shift registers, or from the vertical CCD shift register to the horizontal CCD shift register.

What is claimed is:

1. An image sensor comprising:
   a body of a semiconductor material having a surface;
   a photodetector in the body at the surface and having an edge;
   a shift register channel region in the body and extending along but spaced from the edge of the photodetector;
   first and second conductive gate electrodes over and insulated from the channel region with each of the gate electrodes extending along at least a portion of the edge of the photodetector;
   the first gate electrode having a portion which extends between the shift register channel region and the edge of the photodetector with the photodetector extending along the entire edge of the portion of the first gate electrode; and
   a transfer region in the body at the surface extending between the photodetector and the first gate electrode along the entire edge of the photodetector.

2. The image sensor of claim 1 in which the first gate electrode has an arm which extends along the edge of the photodetector between the photodetector and the second gate.

3. The image sensor of claim 2 wherein the body is of one conductivity type, and the channel region and transfer region are regions of the opposite conductivity type in the body and extending to the surface.

4. The image sensor of claim 3 further comprising a transfer gate over and insulated from the transfer region.

5. The image sensor of claim 4 further comprising a barrier region between the edge of the photodetector and the transfer gate.

6. The image sensor of claim 5 in which the barrier region is a lightly doped region of the opposite conductivity type in the body and extending to the surface.

7. The image sensor of claim 6 further comprising an overflow drain in the body on the side of the photodetector opposite the channel region.

8. The image sensor of claim 3 further comprising a separate barrier region of the opposite conductivity type in the body and extending across the channel region under and along an edge of each of the first and second conductive gate electrodes.

9. The image sensor of claim 8 in which the barrier region under the second gate electrode also extends along an end of the second gate electrode between the second gate electrode and the portion of the first gate electrode which extends along the edge of the same photodetector.

10. The image sensor of claim 9 in which the barrier region under each of the first gate electrodes also extends along an end of its respective first gate.

11. An image sensor comprising:
    a body of semiconductor material of one conductivity type having a surface;
    a plurality of photodetectors in the body at the surface, the photodetectors being arranged in a line with each photodetector having an edge along the line;
    a CCD shift register channel region in the body at the surface and extending along the line of photodetectors spaced from the edges of the photodetectors;
    a plurality of first and second conductive gate electrodes over and insulated from the channel region with adjacent ones of each of the first and second gate electrodes extending along a portion of each of the photodetectors;
    the first gate electrode at each of the photodetectors having a portion extending along the entire edge of the photodetector; and
    a separate transfer region in the body at the surface between each photodetector and the channel region along the entire edge of the photodetector.

12. The image sensor of claim 11 in which each of the first gate electrodes has an arm which extends along the edge of its respective photodetector between the photodetector and the second gate electrode.

13. The image sensor of claim 12 wherein the channel region and each of the transfer regions is a region of opposite conductivity type in the body and extending to the surface.

14. The image sensor of claim 13 further comprising a transfer gate over and insulated from the transfer region.

15. The image sensor of claim 14 further comprising a barrier region between the edge of each of the photodetectors and the transfer regions.

16. The image sensor of claim 15 in which the barrier region is a lightly doped region in the body and extending to the surface.

17. The image sensor of claim 16 further comprising a separate drain region in the body adjacent each of the photodetectors.

18. The image sensor of claim 13 further comprising a barrier region of the opposite conductivity type in the body and extending across the channel region under and along an edge of each of the first and second conductive gate electrodes.

19. The image sensor of claim 18 in which the barrier regions under each of the second gate electrodes also extends along an end of its respective second gate electrodes between the second gate electrode and the portion of the adjacent first gate electrode which extends along the photodetector.

20. The image sensor of claim 19 in which the barrier regions under, each of the first gate electrodes also extends along an end of its respective first gate electrode which is along the photodetector.

* * * * *